(12) United States Patent
Yang et al.

(10) Patent No.: US 11,088,212 B2
(45) Date of Patent: Aug. 10, 2021

(54) OLED DISPLAY SUBSTRATE, MANUFACTURING METHOD AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yuqing Yang, Beijing (CN); Tingyan Yang, Beijing (CN); Chuanyou He, Beijing (CN); Qun Ma, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 77 days.

(21) Appl. No.: 16/489,547

(22) PCT Filed: Apr. 9, 2019

(86) PCT No.: PCT/CN2019/081907
§ 371 (c)(1),
(2) Date: Aug. 28, 2019

(87) PCT Pub. No.: WO2019/205928
PCT Pub. Date: Oct. 31, 2019

(65) Prior Publication Data
US 2020/0411604 A1    Dec. 31, 2020

(30) Foreign Application Priority Data

Apr. 24, 2018  (CN) .......................... 201810375375.4

(51) Int. Cl.
*H01L 51/56* (2006.01)
*H01L 27/32* (2006.01)

(52) U.S. Cl.
CPC .......... *H01L 27/3218* (2013.01); *H01L 51/56* (2013.01)

(58) Field of Classification Search
CPC ............................ H01L 27/3218; H01L 51/56
See application file for complete search history.

(56) References Cited

U.S. PATENT DOCUMENTS 9,491,444 B2    11/2016  Brown
2017/0194394 A1*  7/2017  Hou ..................... H01L 51/0012

FOREIGN PATENT DOCUMENTS

CN        103367391 A    10/2013
CN        104733501 A     6/2015
(Continued)

OTHER PUBLICATIONS

First Office Action for CN Appl. No. 201810375375.4, dated Mar. 9, 2020, 16 pages with English translation.

*Primary Examiner* — Thomas L Dickey
(74) *Attorney, Agent, or Firm* — The Webb Law Firm

(57) ABSTRACT

The disclosure relates to an OLED display substrate, a manufacturing method and a display apparatus. The OLED display substrate comprises a base substrate, and a plurality of light-emitting elements and a plurality of pixel defining layers formed on the base substrate, wherein a pixel defining layer is located between any two adjacent light-emitting elements of the plurality of light-emitting elements; and a surface of the pixel defining layer facing away from the base substrate comprises an accommodating portion, a bottom surface of the accommodating portion and the surface of the pixel defining layer facing away from the base substrate are located at different planes, and an orthographic projection of the accommodating portion on the base substrate does not overlap with an orthographic projection of the plurality of light-emitting elements on the base substrate. The method (Continued)

for manufacturing the OLED display substrate is configured to manufacture the above OLED display substrate.

8 Claims, 4 Drawing Sheets

(56) References Cited

FOREIGN PATENT DOCUMENTS

| | | |
|---|---|---|
| CN | 105118845 A | 12/2015 |
| CN | 106654047 A | 5/2017 |
| CN | 107068721 A | 8/2017 |
| CN | 107093680 A | 8/2017 |
| CN | 107170904 A | 9/2017 |
| CN | 107425126 A | 12/2017 |
| CN | 206774550 U | 12/2017 |
| CN | 108649050 A | 10/2018 |

* cited by examiner

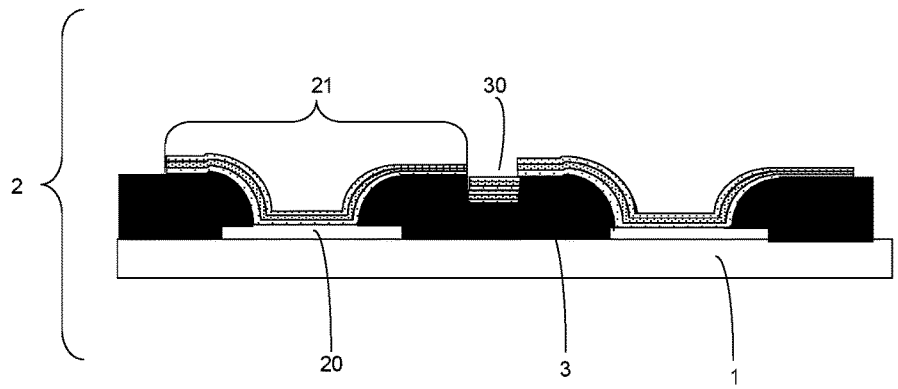

FIG. 3

```
                    ┌─────────────────────────────┐  ┌── S100
                    │  providing a base substrate │
                    └──────────────┬──────────────┘
                                   ↓                    ┌─ S200
┌──────────────────────────────────────────────────────────────────────┐
│ forming a plurality of light-emitting elements and a plurality of pixel defining layers on a
│ surface of the base substrate, wherein the pixel defining layer is located between any two
│ adjacent light-emitting elements of the plurality of light-emitting elements; and forming an
│ accommodating portion on a surface of a respective pixel defining layer facing away from the
│ base substrate, wherein an orthographic projection of the accommodating portion on the base
│ substrate does not overlap with an orthographic projection of the plurality of light-emitting
│ elements on the base substrate, and a bottom surface of the accommodating portion and the
│ surface of the respective pixel defining layer facing away from the base substrate are located at
│                                   different planes
└──────────────────────────────────────────────────────────────────────┘
```

OLED DISPLAY SUBSTRATE, MANUFACTURING METHOD AND DISPLAY APPARATUS

CROSS REFERENCE TO RELATED APPLICATIONS

This application is a U.S. National Stage Application under 35 U.S.C. § 371 of International Patent Application No. PCT/CN2019/081907, as filed on Apr. 9, 2019, which claims priority to Chinese Patent Application No. 201810375375.4, as filed on Apr. 24, 2018, the disclosure of each of which is incorporated herein in entirety by reference.

TECHNICAL FIELD

The disclosure relates to an OLED display substrate, a method of manufacturing the same, and a display apparatus.

BACKGROUND

An Organic Light-Emitting Display (OLED) is a high-contrast flexible display apparatus with features of self-illumination, wide viewing angles and fast response.

The OLED display in the prior art mainly comprises an OLED display substrate.

SUMMARY

The disclosure provides the following technical solutions:

An OLED display substrate which comprises: a base substrate; and a plurality of light-emitting elements and a plurality of pixel defining layers formed on the base substrate, wherein a respective pixel defining layer is located between any two adjacent light-emitting elements of the plurality of light-emitting elements; and a surface of the respective pixel defining layer facing away from the base substrate comprises an accommodating portion, a bottom surface of the accommodating portion and the surface of the respective pixel defining layer facing away from the base substrate are located at different planes, and an orthographic projection of the accommodating portion on the base substrate does not overlap with an orthographic projection of the plurality of light-emitting elements on the base substrate.

The disclosure also provides a method for manufacturing an OLED display substrate, which comprises:

providing a base substrate; and forming a plurality of light-emitting elements and a plurality of pixel defining layers on a surface of the base substrate, wherein a respective pixel defining layer is located between any two adjacent light-emitting elements of the plurality of light-emitting elements; and forming an accommodating portion on a surface of the respective pixel defining layer facing away from the base substrate, wherein an orthographic projection of the accommodating portion on the base substrate does not overlap with an orthographic projection of the plurality of light-emitting elements on the base substrate, and a bottom surface of the accommodating portion and the surface of the respective pixel defining layer facing away from the base substrate are located at different planes.

The disclosure also provides a display apparatus comprising the OLED display substrate provided by the above technical solution and a cover plate.

BRIEF DESCRIPTION OF THE DRAWINGS

The drawings described herein are intended to provide a further understanding of the disclosure, and constitute a portion of the disclosure. The illustrative embodiments of the disclosure and the description thereof are intended to explain the disclosure, and do not constitute an undue limitation of the disclosure. In the drawings:

FIG. 3 is a schematic structural cross-sectional view of the OLED display substrate provided by the embodiments of the disclosure;

FIG. 4 is a flowchart of a method for manufacturing the OLED display substrate provided by the embodiments of the disclosure;

DETAILED DESCRIPTION

The technical solutions in the embodiments of the disclosure will be clearly and completely described in the following in combination with the accompanying drawings in the embodiments of the disclosure. It is obvious that the described embodiments are only a portion of the embodiments of the disclosure, and are not all the embodiments. All other embodiments obtained by those skilled in the art based on the embodiments of the disclosure without inventive labors belong to the protection scope of the disclosure.

Figure 1:
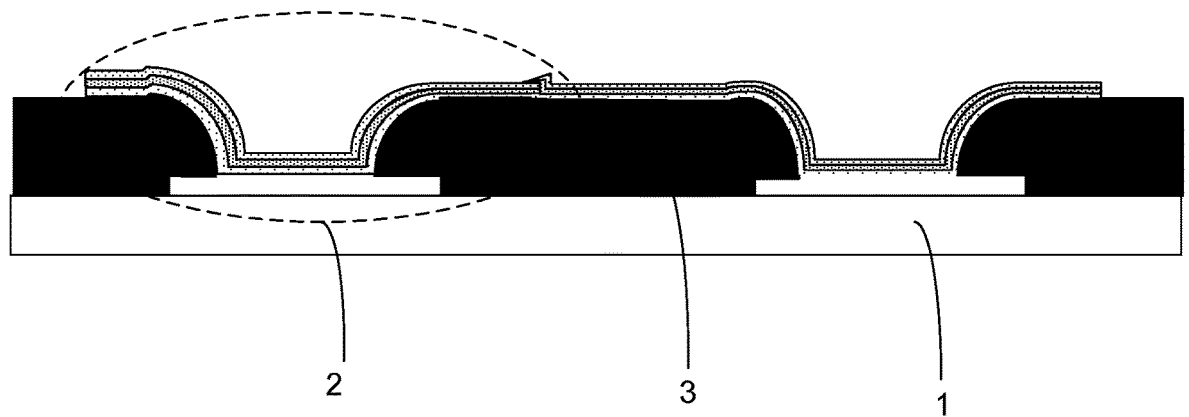
FIG. 1 is a schematic structural view of an OLED display substrate in the related art.

As shown in FIG. 1, the OLED display substrate comprises light-emitting elements arranged in manner of pixels, which are formed on a surface of the base substrate by using a film forming process. Two adjacent light-emitting elements are defined by a respective pixel defining layer. As a resolution of the OLED display is higher and higher, a distance between two adjacent light-emitting elements is gradually reduced. Therefore, when the plurality of light-emitting elements arranged in manner of pixels are manufactured, light-emitting film layers of two adjacent light-emitting elements are superimposed on each other in the respective pixel defining layer. As such, when a screen is displayed, light emitted from the light-emitting film layer between two adjacent pixels may cause mutual crosstalk, resulting in a problem of screen defects such as color cast on the displayed screen, or the like.

For example, as shown in FIG. 1, in two adjacent light-emitting elements 2 of the OLED display substrate in the related art, a first light-emitting element is a red light-emitting element, and a second light-emitting element is a green light-emitting element. When the green light-emitting element is laid on the red light-emitting element, the displayed screen is cyan.

An object of the disclosure is to provide an OLED display substrate, a manufacturing method and a display apparatus, which reduce the mutual crosstalk between lights from two adjacent pixel when displaying a screen, thereby reducing the problem of the color cast of the displayed screen.

As compared with the prior art, in the OLED display substrate provided by the disclosure, a surface of the respective pixel defining layer facing away from the base substrate comprises an accommodating portion, an orthographic projection of the accommodating portion on the base substrate does not overlap with an orthographic projection of the plurality of light-emitting elements on the base substrate. Since a bottom surface of the accommodating portion and the surface of the respective pixel defining layer facing away from the base substrate are located at different planes, when the light-emitting function layers of the plurality of light-emitting elements extend to the accommodating portion in the respective pixel defining layer, a breakage between a portion of the light-emitting function layer located on the surface of the respective pixel defining layer and a portion thereof falling in the accommodating portion may occur because there is a step difference between the surface of the respective pixel defining layer and the accommodating portion, thereby avoiding any two adjacent light-emitting elements from being driven to emit light when the screen is displayed. Therefore, it is possible to ensure that the light emitted by any two adjacent light-emitting elements is not mutually cross-talked when the screen is displayed, thereby reducing the problem of the color cast of the displayed screen.

As compared with the prior art, the beneficial effects of the method for manufacturing the OLED display substrate provided by the disclosure are the same as those of the OLED display substrate provided by the above technical solution, which are not repeated herein.

As compared with the prior art, the beneficial effects of the display apparatus provided by the disclosure are the same as those of the OLED display substrate provided by the above technical solution, which are not repeated herein.

Figure 2:
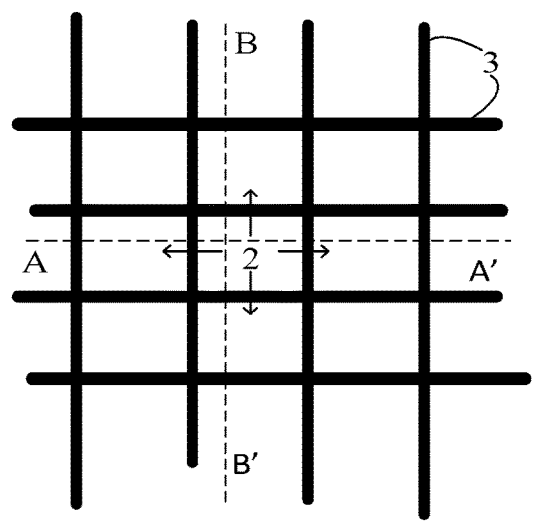
FIG. 2 is a schematic structural top view of an OLED display substrate provided by embodiments of the disclosure.

Referring to FIG. 2 and FIG. 3, an OLED display substrate provided by embodiments of the disclosure comprises: a base substrate 1, and a plurality of light-emitting elements 2 and a plurality of pixel defining layers 3 formed on the base substrate 1, wherein a respective pixel defining layer 3 is located between any two adjacent light-emitting elements of the plurality of light-emitting elements 2; and a surface of the respective pixel defining layer 3 facing away from the base substrate 1 comprises an accommodating portion 30, a bottom surface of the accommodating portion 30 and the surface of the respective pixel defining layer 3 facing away from the base substrate 1 are located at different planes, and an orthographic projection of the accommodating portion 30 on the base substrate 1 does not overlap with an orthographic projection of the plurality of light-emitting elements 2 on the base substrate 1.

FIG. 2 is a schematic structural top view of an OLED display substrate provided by embodiments of the disclosure. As shown in FIG. 2, each of the plurality of light-emitting elements 2 is adjacent to at least four surrounding light-emitting elements.

A schematic structural cross-sectional view of the OLED display substrate as shown in FIG. 3 can be obtained by cutting along the A-A' direction or the B-B' direction of the OLED display substrate in FIG. 2. As shown in FIG. 3, each of the plurality of light-emitting elements 2 comprises a first sub-electrode, a light-emitting function layer and a second electrode (not shown) which are laminated in sequence, and the light-emitting function layer of any one of the plurality of light-emitting elements 2 extends to a portion of the respective pixel defining layer surrounding a respective light-emitting element, and an orthographic projection of the accommodating portion, which is located on the portion of the respective pixel defining layer surrounding the respective light-emitting element, on the base substrate at least partially overlaps with an orthographic projection of the light-emitting function layer on the base substrate.

The method for manufacturing the OLED display substrate provided by the embodiments of the disclosure will be described in detail below in combination with FIG. 4 and FIG. 5.

Step S100: providing a base substrate 1;

Step S200: forming a plurality of light-emitting elements 2 and a plurality of pixel defining layers 3 on a surface of the base substrate 1, wherein a respective pixel defining layer 3 is located between any two adjacent light-emitting elements of the plurality of light-emitting elements 2; and an accommodating portion 30 is formed on a surface of the respective pixel defining layer 3 facing away from the base substrate 1, an orthographic projection of the accommodating portion 30 on the base substrate 1 does not overlap with an orthographic projection of the plurality of light-emitting elements 2 on the base substrate 1, and a bottom surface of the accommodating portion 30 and the surface of the respective pixel defining layer 3 facing away from the base substrate 1 are located at different planes.

For example, as shown in FIG. 3, each of the plurality of light-emitting elements 2 comprises the first sub-electrode 20, the light-emitting function layer 21 and the second electrode (not shown) which are laminated in sequence; wherein the first sub-electrodes 20 and the second electrode are often made of a semiconductor material such as indium tin oxide or the like; and the light-emitting function layer 21 comprises a hole injection layer, an electron transportation layer, and an organic emission layer between the hole injection layer and the electron transportation layer, and the hole injection layer, the electron transportation layer and the organic emission layer are made of an organic material. Based on this, in the prior art, the first sub-electrode 20 and the second electrode are manufactured by a process such as magnetron sputtering or the like, and the hole injection layer, the electron transportation layer and the organic emission layer are manufactured by an evaporation process.

Figure 5:
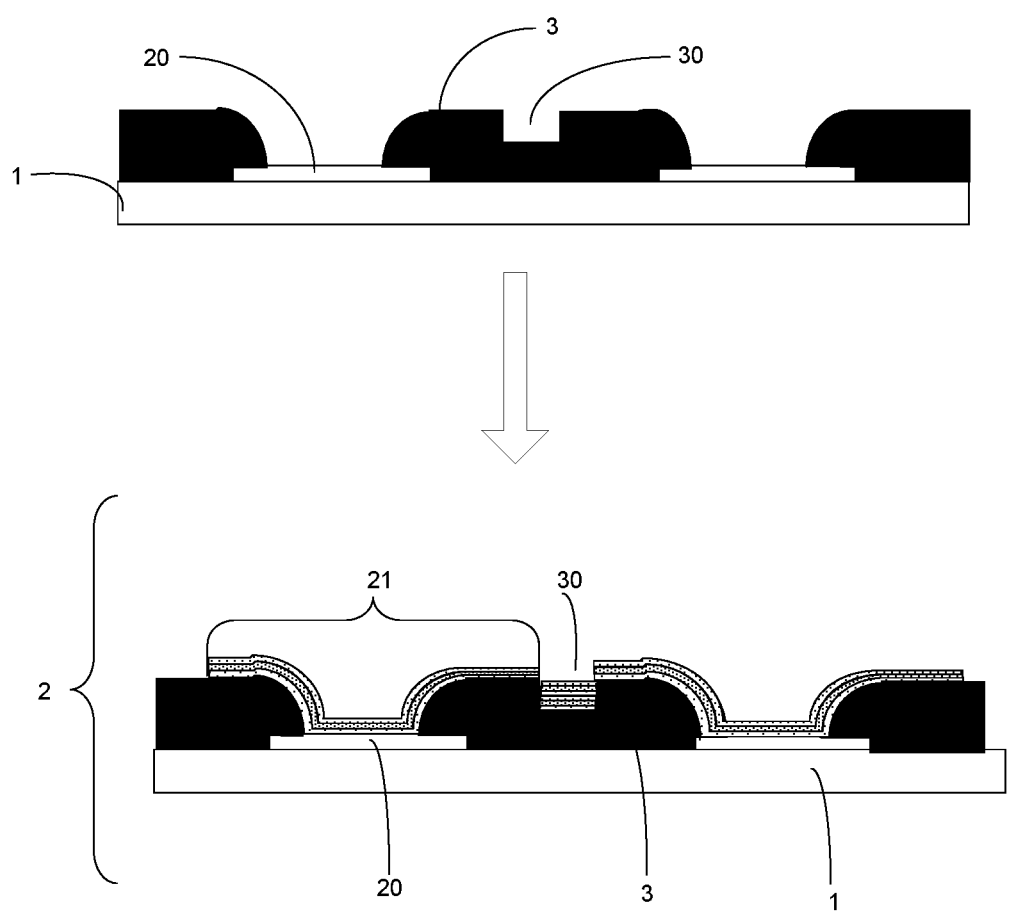
FIG. 5 is a schematic diagram of a process of manufacturing the OLED display substrate provided by the embodiments of the disclosure.
Figure 6:
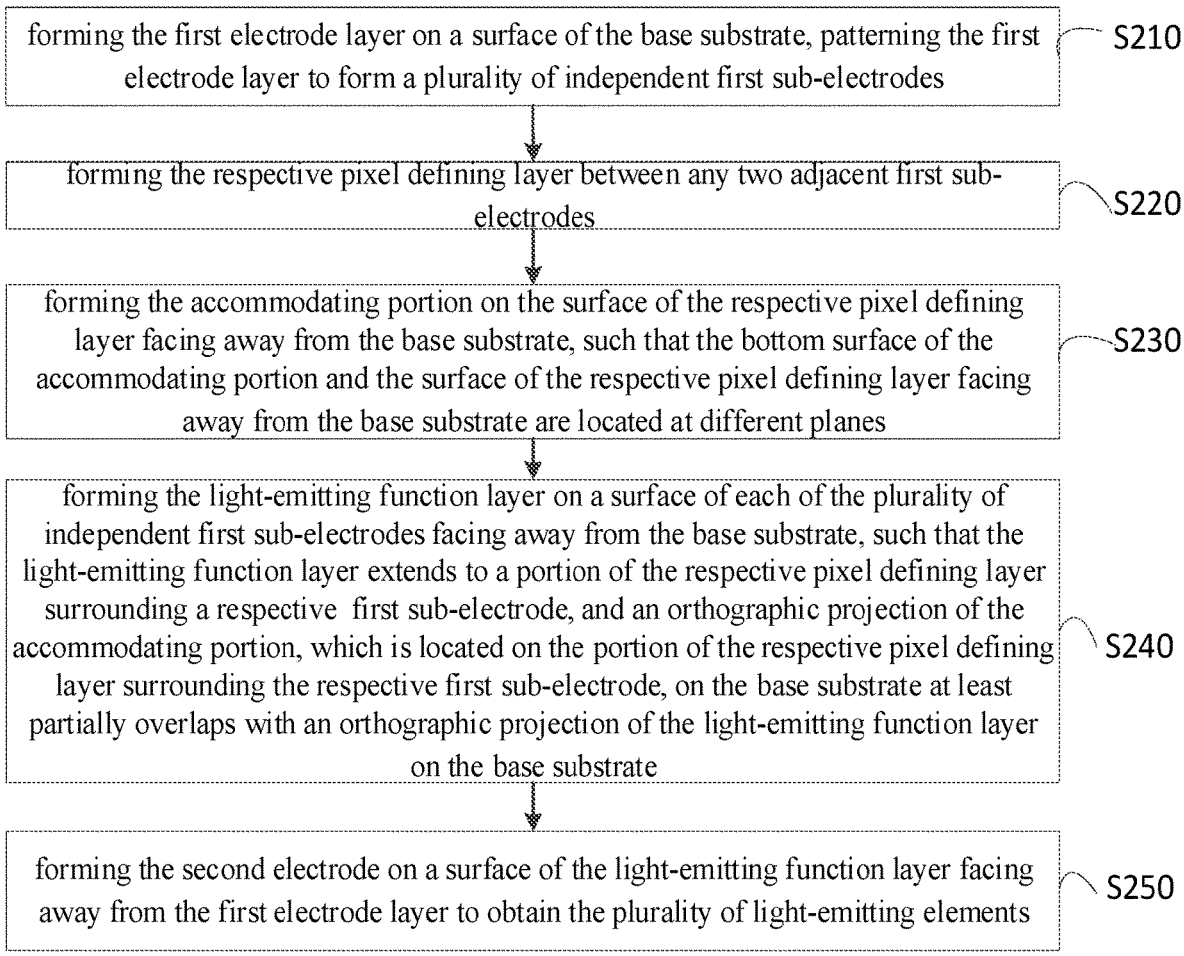
FIG. 6 illustrates forming a plurality of light-emitting elements and a plurality of pixel defining layers on a surface of a base substrate in the embodiments of the disclosure.

At this time, as shown in FIG. 3, FIG. 5 and FIG. 6, the plurality of light-emitting elements 2 and the plurality of pixel defining layers 3 are formed on the surface of the base substrate 1, wherein each of the plurality of light-emitting elements 2 comprises the first sub-electrode 20, the light-emitting function layer 21 and the second electrode which are laminated in sequence;

Step S210: forming the first electrode layer on the surface of the base substrate 1, and patterning the first electrode layer to form a plurality of independent first sub-electrodes 20.

Step S220: forming the respective pixel defining layer 3 between any two adjacent first sub-electrodes.

Step S230: forming the accommodating portion 30 on the surface of the respective pixel defining layer 3 facing away from the base substrate 1, such that the bottom surface of the accommodating portion 30 and the surface of the respective pixel defining layer 3 facing away from the base substrate 1 are located at different planes.

Step S240: forming the light-emitting function layer 21 on a surface of each of the plurality of independent first sub-electrodes facing away from the base substrate 1, such that the light-emitting function layer extends to a portion of the respective pixel defining layer 3 surrounding the first sub-electrode, and an orthographic projection of the accommodating portion, which is located on the portion of the respective pixel defining layer 3 surrounding the first sub-electrode, on the base substrate 1 at least partially overlaps with an orthographic projection of the light-emitting function layer 21 on the base substrate 1. At this time, since a bottom surface of the accommodating portion 30 and the surface of the respective pixel defining layer 3 facing away from the base substrate 1 are located at different planes, when the light-emitting function layers 21 of the plurality of light-emitting elements 2 extend to the accommodating portion 30 in the respective pixel defining layer 3, a breakage between a portion of the light-emitting function layer located on the surface of the respective pixel defining layer and a portion thereof falling in the accommodating portion may occur because there is a step difference between the surface of the respective pixel defining layer and the accommodating portion, thereby avoiding light-emitting elements adjacent to a certain light-emitting element from being driven to emit light while the certain light-emitting element is driven to emit light in the case that the screen is displayed. Therefore, it is possible to ensure that the light emitted by the certain light-emitting element and the light emitted simultaneously by the plurality of light-emitting elements adjacent to the certain light-emitting element are not mutually affected in the case that the screen is displayed, thereby reducing the problem of the color cast of the displayed screen.

Step S250: forming the second electrode (not shown) on a surface of each of the light-emitting function layer 21 facing away from the first electrode layer to obtain the plurality of light-emitting elements 2.

In the OLED display substrate provided by the embodiments of the disclosure, the surface of the respective pixel defining layer 3 facing away from the base substrate 1 comprises the accommodating portion 30, and the orthographic projection of the accommodating portion 30 on the base substrate 1 does not overlap with the orthographic projection of the respective light-emitting element 2 on the base substrate 1. Since a bottom surface of the accommodating portion 30 and the surface of the respective pixel defining layer 3 facing away from the base substrate 1 are located at different planes, when the light-emitting function layers 21 of the plurality of light-emitting elements 2 extend to the accommodating portion 30 in the respective pixel defining layer 3, a breakage between a portion of the light-emitting function layer located on the surface of the respective pixel defining layer and a portion thereof falling in the accommodating portion may occur because there is a step difference between the surface of the respective pixel defining layer and the accommodating portion, thereby avoiding any two adjacent light-emitting elements 2 from being driven to emit light when the screen is displayed. Therefore, it is possible to ensure that the light emitted by any two adjacent light-emitting elements 2 is not mutually cross-talked when the screen is displayed, thereby reducing the problem of the color cast of the displayed screen.

As shown in FIG. 3, in any two adjacent light-emitting elements 2 of the OLED display substrate in the embodiments of the disclosure, the first light-emitting element is a red light-emitting element, and the second light-emitting element is a green light-emitting element. When the light-emitting function layer of the first light-emitting element and the light-emitting function layer of the second light-emitting element extend to the accommodating portion 30 in the respective pixel defining layer 3, a breakage between the portion of the light-emitting function layer located on the surface of the respective pixel defining layer and the portion thereof falling in the accommodating portion occurs because there is a step difference between the surface of the respective pixel defining layer and the accommodating portion. At this time, the displayed screen is normal, and the problem of the color cast does not occur.

It can be understood that, in the embodiments of the disclosure, a plurality of pixel compensation circuits should be formed on the base substrate 1, and the plurality of pixel compensation circuits are in one-to-one correspondence with the plurality of light-emitting elements 2, such that each of the pixel compensation circuits drives the corresponding light-emitting element 2 to emit the light.

For example, the accommodating portion 30 of the embodiments of the disclosure may comprise one or more raised structures protruding upward, may also comprise one or more recessed portions which are concaved inward along a direction in which the respective pixel defining layer 3 faces toward the base substrate 1, or may be a combination of both the raised structure and the recessed portion. When the accommodating portion 30 is the raised structure, since the bottom surface of the raised structure is higher than the surface of the respective pixel defining layer 3 facing away from the base substrate 1, when the light-emitting function layers 21 of the plurality of light-emitting elements 2 extend to the raised structure in the respective pixel defining layer 3, a breakage between the portion of the light-emitting function layer located on the surface of the respective pixel defining layer and the portion thereof falling in the accommodating portion occurs because there is a step difference between the surface of the respective pixel defining layer and the accommodating portion. Similarly, when the accommodating portion 30 is the recessed portion, since the bottom surface of the recessed portion is lower than the surface of the respective pixel defining layer 3 facing away from the base substrate 1, when the light-emitting function layers 21 of the plurality of light-emitting elements 2 extend to the recessed portion in the respective pixel defining layer 3, a breakage between the portion of the light-emitting function layer located on the surface of the respective pixel defining layer and the portion thereof falling in the accommodating portion may occur because there is a step difference between the surface of the respective pixel defining layer and the accommodating portion. Hereinafter, the accommodating portion 30 being the recessed portion will be described as an example in detail.

As shown in FIG. 3 and FIG. 5, when the accommodating portion 30 is the recessed portion, the recessed portion is formed on a surface of the respective pixel defining layer 3 facing away from the base substrate 1. The specific structure of the recessed portion may be an irregular structure or a regular structure such as trapezoidal, rectangular or the like, as long as a bottom surface of the recessed portion and the surface of the corresponding respective pixel defining layer 3 facing away from the base substrate 1 are located at different planes, and the orthographic projection of the recessed portion on the base substrate does not overlap with the orthographic projection of the plurality of light-emitting elements on the base substrate.

The recessed portion is formed in the respective pixel defining layer between the two adjacent light-emitting elements 2. As such, when the light-emitting function layers 21 of the two adjacent light-emitting elements 2 extend to the recessed portion in the respective pixel defining layer, a breakage between the portion of the light-emitting function layer located on the surface of the respective pixel defining layer and the portion thereof falling in the accommodating portion may occur because there is a step difference between the surface of the respective pixel defining layer and the accommodating portion. Therefore, as shown in FIG. 3 and FIG. 5, in the embodiments of the disclosure, a slope angle formed by an inner wall of the recessed portion and the surface of the base substrate 1 ranges from about 70° to about 90°. In this case, the recessed portion has a large drop, which is more advantageous for that a breakage between the light-emitting function layers of the two adjacent light-emitting elements occurs when extending to the recessed portion in the respective pixel defining layer, further reducing the light crosstalk between the two adjacent light-emitting elements 2.

It can be understood that, as shown in FIG. 3 and FIG. 5, in the embodiments of the disclosure, the bottom of the recessed portion serves as the bottom surface of the accommodating portion 30, and the bottom surface is parallel to the surface of the base substrate 1. Of course, the bottom surface of the recessed portion may be not parallel to the surface of the base substrate 1.

In addition, in the embodiments of the disclosure, the cross-sectional shape of the recessed portion may be any shape, as long as the orthographic projection of the recessed portion on the base substrate does not overlap with the orthographic projection of the plurality of light-emitting elements on the base substrate.

As shown in FIG. 3 to FIG. 5, the embodiments of the disclosure further provide a method for manufacturing an OLED display substrate, which comprises:

Step S100: providing a base substrate 1,

Step S200: forming a plurality of light-emitting elements 2 and a plurality of pixel defining layers 3 on a surface of the base substrate 1, wherein a respective pixel defining layer 3 is located between any two adjacent light-emitting elements of the plurality of light-emitting elements 2; and an accommodating portion 30 is formed on a surface of the respective pixel defining layer 3 facing away from the base substrate 1, an orthographic projection of the accommodating portion 30 on the base substrate 1 does not overlap with an orthographic projection of the plurality of light-emitting elements 2 on the base substrate 1, and a bottom surface of the accommodating portion 30 and the surface of the respective pixel defining layer facing 3 away from the base substrate 1 are located at different planes.

As compared with the prior art, the beneficial effects of the method for manufacturing the OLED display substrate provided by the disclosure are the same as those of the OLED display substrate provided by the above embodiments, which are not repeated herein.

For example, as shown in FIG. 3, each of the plurality of light-emitting elements 2 comprises a first sub-electrode 20, a light-emitting function layer 21 and a second electrode (not shown) which are laminated in sequence. As shown in FIG. 3, FIG. 5 and FIG. 6, forming the plurality of light-emitting elements 2 and the plurality of pixel defining layers 3 on the surface of the base substrate 1 comprises:

Step S210: forming a first electrode layer on a surface of the base substrate 1, and patterning the first electrode layer to form a plurality of independent first sub-electrodes 20;

Step S220: forming the respective pixel defining layer 3 between any two adjacent first sub-electrodes;

Step S230: forming the accommodating portion on the surface of the respective pixel defining layer 3 facing away from the base substrate 1, such that the bottom surface of the accommodating portion 30 and the surface of the respective pixel defining layer 3 facing away from the base substrate 1 are located at different planes;

Step S240: forming the light-emitting function layer 21 on a surface of each of the plurality of independent first sub-electrodes facing away from the base substrate 1, such that the light-emitting function layer 21 extends to a portion of the respective pixel defining layer 3 surrounding the first sub-electrode, and an orthographic projection of the accommodating portion, which is located on the portion of the respective pixel defining layer 3 surrounding the first sub-electrode, on the base substrate 1 at least partially overlaps with an orthographic projection of the light-emitting function layer 21 on the base substrate 1;

Step S250: forming the second electrode (not shown) on the surface of the light-emitting function layer 21 facing away from the first electrode layer to obtain the plurality of light-emitting elements 2.

In the embodiments of the disclosure, forming the accommodating portion on the surface of each of the plurality of pixel defining layers 3 facing away from the base substrate 1 comprises forming the recessed portion as the accommodating portion 30 on the surface of the respective pixel defining layer 3 facing away from the base substrate 1. There are various methods to form the recessed portion. For example, the recessed portion may be formed by an exposure process or an etching process, and of course, other hole forming processes may be used.

As shown in FIG. 3, a slope angle formed by an inner wall of the recessed portion and a surface of the base substrate 1 ranges from about 70 to about 90, and a bottom surface of the recessed portion is parallel to the surface of the base substrate 1.

As shown in FIG. 3, the embodiments of the disclosure further provide a display apparatus, which comprises the OLED display substrate provided by the above embodiments and a cover plate. According to the embodiments of the disclosure, the OLED display substrate may be bonded to the cover plate.

As compared with the prior art, the beneficial effects of the display apparatus provided by the embodiments of the disclosure are the same as those of the OLED display substrate provided by the above embodiments, which are not repeated herein.

The display apparatus may be any product or component having a display function, such as a mobile phone, a tablet computer, a television, a display, a notebook computer, a digital photo frame, a navigator or the like.

In the description of the above embodiments, specific features, structures, materials or characteristics may be combined in any suitable manner in any one or more embodiments or examples.

The above is only the specific embodiments of the disclosure, but the scope of the disclosure is not limited thereto. Any person skilled in the art can easily think of changes or substitutions within the technical scope of the disclosure. They should be covered within the scope of protection of the disclosure. Therefore, the scope of protection of the disclosure should be determined by the scope of protection of the claims.

What is claimed is:

1. An OLED display substrate comprising:
    a base substrate; and
    a plurality of light-emitting elements and a plurality of pixel defining layers formed on the base substrate,
    wherein a respective pixel defining layer is located between any two adjacent light-emitting elements of the plurality of light-emitting elements;
    a surface of the respective pixel defining layer facing away from the base substrate comprises an accommodating portion, a bottom surface of the accommodating portion and the surface of the respective pixel defining layer facing away from the base substrate are located at different planes, and an orthographic projection of the accommodating portion on the base substrate does not overlap with an orthographic projection of the plurality of light-emitting elements on the base substrate;
the accommodating portion comprises a recessed portion which is disposed in the surface of the respective pixel defining layer facing away from the base substrate; and
a slope angle formed by an inner wall of the recessed portion and the bottom surface ranges between about 70° and about 90°, and the bottom surface is parallel to a surface of the base substrate.

2. The OLED display substrate according to claim 1, wherein each of the plurality of light-emitting elements comprises a first electrode layer, a light-emitting function layer and a second electrode which are laminated in sequence, the light-emitting function layer of any one of the plurality of light-emitting elements extends to a portion of the respective pixel defining layer surrounding a respective light-emitting element, and an orthographic projection of the accommodating portion, which is located on the portion of the respective pixel defining layer surrounding the respective light-emitting element, on the base substrate at least partially overlaps with an orthographic projection of the light-emitting function layer on the base substrate.

3. A display apparatus comprising the OLED display substrate according to claim 1 and a cover plate.

4. The display apparatus according to claim 3, wherein each of the plurality of light-emitting elements comprises a first electrode layer, a light-emitting function layer and a second electrode which are laminated in sequence, the light-emitting function layer of any one of the plurality of light-emitting elements extends to a portion of the respective pixel defining layer surrounding a respective light-emitting element, and an orthographic projection of the accommodating portion, which is located on the portion of the respective pixel defining layer surrounding the respective light-emitting element, on the base substrate at least partially overlaps with an orthographic projection of the light-emitting function layer on the base substrate.

5. A method for manufacturing an OLED display substrate comprising:
providing a base substrate; and
forming a plurality of light-emitting elements and a plurality of pixel defining layers on a surface of the base substrate,
wherein a respective pixel defining layer is located between any two adjacent light-emitting elements of the plurality of light-emitting elements; and
forming an accommodating portion on a surface of the respective pixel defining layer facing away from the base substrate,
wherein an orthographic projection of the accommodating portion on the base substrate does not overlap with an orthographic projection of the plurality of light-emitting elements on the base substrate, and a bottom surface of the accommodating portion and the surface of the respective pixel defining layer facing away from the base substrate are located at different planes;
the accommodating portion comprises a recessed portion which is disposed in the surface of the respective pixel defining layer facing away from the base substrate; and
a slope angle formed by an inner wall of the recessed portion and the bottom surface ranges between about 70° and about 90°, and the bottom surface is parallel to a surface of the base substrate.

6. The method for manufacturing the OLED display substrate according to claim 5, wherein each of the plurality of light-emitting elements comprises a first electrode layer, a light-emitting function layer and a second electrode which are laminated in sequence; and the method further comprising:
forming the plurality of light-emitting elements and the plurality of pixel defining layers on the surface of the base substrate comprises:
forming the first electrode layer on a surface of the base substrate;
patterning the first electrode layer to form a plurality of independent first sub-electrodes;
forming the respective pixel defining layer between any two adjacent first sub-electrodes;
forming the accommodating portion on the surface of the respective pixel defining layer facing away from the base substrate, such that the bottom surface of the accommodating portion and the surface of the respective pixel defining layer facing away from the base substrate are located at different planes;
forming the light-emitting function layer on a surface of each of the plurality of independent first sub-electrodes facing away from the base substrate, such that the light-emitting function layer extends to a portion of the respective pixel defining layer surrounding the first sub-electrode, and an orthographic projection of the accommodating portion, which is located on the portion of the respective pixel defining layer surrounding the first sub-electrode, on the base substrate at least partially overlaps with an orthographic projection of the light-emitting function layer on the base substrate; and
forming the second electrode on a surface of the light-emitting function layer facing away from the first electrode layer to obtain the plurality of light-emitting elements.

7. An OLED display substrate comprising:
a base substrate; and
a plurality of light-emitting elements and a plurality of pixel defining layers formed on the base substrate,
wherein a respective pixel defining layer is located between any two adjacent light-emitting elements of the plurality of light-emitting elements;
a surface of the respective pixel defining layer facing away from the base substrate comprises an accommodating portion, a bearing surface of the accommodating portion is higher than the surface of the respective pixel defining layer facing away from the base substrate are located at different planes, and an orthographic projection of the accommodating portion on the base substrate does not overlap with an orthographic projection of the plurality of light-emitting elements on the base substrate;
the accommodating portion comprises a raised structure which is disposed on the surface of the respective pixel defining layer facing away from the base substrate; and
a slope angle formed by an outer wall of the raised structure and the bearing surface ranges between about 70° and about 90°, and the bearing surface is parallel to a surface of the base substrate.

8. The OLED display substrate according to claim 7, wherein each of the plurality of light-emitting elements comprises a first electrode layer, a light-emitting function layer and a second electrode which are laminated in sequence, the light-emitting function layer of any one of the plurality of light-emitting elements extends to a portion of the respective pixel defining layer surrounding a respective light-emitting element, and an orthographic projection of the accommodating portion, which is located on the portion of the respective pixel defining layer surrounding the respective light-emitting element, on the base substrate at least partially overlaps with an orthographic projection of the light-emitting function layer on the base substrate.

* * * * *